(12) United States Patent
Song et al.

(10) Patent No.: US 10,394,465 B2
(45) Date of Patent: Aug. 27, 2019

(54) SEMICONDUCTOR DEVICE WITH TEMPORARY MEMORY CHIP AND METHOD FOR DRIVING THE SAME

(71) Applicant: SK hynix Inc., Gyeonggi-do (KR)

(72) Inventors: Young-Ook Song, Gyeonggi-do (KR); Yong-Kee Kwon, Gyeonggi-do (KR); Yong-Ju Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/089,195

(22) Filed: Apr. 1, 2016

(65) Prior Publication Data

US 2017/0123695 A1 May 4, 2017

(30) Foreign Application Priority Data

Oct. 28, 2015 (KR) .................. 10-2015-0150145

(51) Int. Cl.
| | |
|---|---|
| *G06F 12/00* | (2006.01) |
| *G06F 3/06* | (2006.01) |
| *G11C 5/02* | (2006.01) |
| *G11C 7/12* | (2006.01) |
| *G11C 7/04* | (2006.01) |
| *G06F 13/00* | (2006.01) |
| *G06F 13/28* | (2006.01) |

(52) U.S. Cl.
CPC .......... *G06F 3/0619* (2013.01); *G06F 3/0616* (2013.01); *G06F 3/0629* (2013.01); *G06F 3/0683* (2013.01); *G11C 5/02* (2013.01); *G11C 5/025* (2013.01); *G11C 7/04* (2013.01); *G11C 7/12* (2013.01)

(58) Field of Classification Search
CPC .... G06F 3/0619; G06F 3/0616; G06F 3/0629; G06F 3/0683; G11C 5/02; G11C 7/12
See application file for complete search history.

(56) References Cited

U.S. PATENT DOCUMENTS

| | | | | |
|---|---|---|---|---|
| 9,053,036 B2* | 6/2015 | Jain | ...................... | G06F 11/002 |
| 2006/0041729 A1* | 2/2006 | Rider | ..................... | G06F 12/02 |
| | | | | 711/165 |
| 2008/0103634 A1* | 5/2008 | Santos | ................... | G05D 23/19 |
| | | | | 700/299 |
| 2013/0275665 A1* | 10/2013 | Saraswat | ................. | G11C 7/04 |
| | | | | 711/106 |
| 2014/0140156 A1* | 5/2014 | Shoemaker | .............. | G11C 7/04 |
| | | | | 365/201 |
| 2014/0241048 A1* | 8/2014 | Farooq | ............... | G11C 13/0004 |
| | | | | 365/163 |

(Continued)

FOREIGN PATENT DOCUMENTS

KR 100308173 11/2001

*Primary Examiner* — Mark A Giardino, Jr.
(74) *Attorney, Agent, or Firm* — IP & T Group LLP

(57) ABSTRACT

A semiconductor device includes: a first memory chip including a plurality of first memory regions; a temporary memory chip including a plurality of temporary memory regions; and a control chip suitable for accessing a first access target memory region among the plurality of first memory regions or a first temporary memory region among the plurality of temporary memory regions based on first access information and first temperature readout information corresponding to the plurality of first memory regions.

11 Claims, 18 Drawing Sheets

(56) References Cited

U.S. PATENT DOCUMENTS

2016/0004636 A1\* 1/2016 Yang .................. G06F 12/0895
  711/118
2017/0046079 A1\* 2/2017 Chinnakkonda
  Vidyapoornachary ......................
  G06F 3/0616

\* cited by examiner

| | B0 | B1 | B2 | B3 | B4 | B5 | B6 | B7 |
|---|---|---|---|---|---|---|---|---|
| MEMORY0~3 | T0 | T1 | T2 | T3 | T4 | T5 | T6 | T7 |

|  | B0 | B1 | B2 | B3 | B4 | B5 | B6 | B7 |
|---|---|---|---|---|---|---|---|---|
| MEMORY0 | T00 | T01 | T02 | T03 | T04 | T05 | T06 | T07 |
| MEMORY1 | T10 | T11 | T12 | T13 | T14 | T15 | T16 | T17 |
| MEMORY2 | T20 | T21 | T22 | T23 | T24 | T25 | T26 | T27 |
| MEMORY3 | T30 | T31 | T32 | T33 | T34 | T35 | T36 | T37 |

|  | B0 | B1 | B2 | B3 | B4 | B5 | B6 | B7 |
|---|---|---|---|---|---|---|---|---|
| MEMORY0 | T00 | T01 | T02 | T03 | T04 | T05 | T06 | T07 |
| MEMORY1 | T10 | T11 | T12 | T13 | T14 | T15 | T16 | T17 |
| MEMORY2 | T20 | T21 | T22 | T23 | T24 | T25 | T26 | T27 |
| MEMORY3 | T30 | T31 | T32 | T33 | T34 | T35 | T36 | T37 |

|  | B0 | B1 | B2 | B3 | B4 | B5 | B6 | B7 |
|---|---|---|---|---|---|---|---|---|
| MEMORY0 | 0/1 | 0/1 | 0/1 | 0/1 | 0/1 | 0/1 | 0/1 | 0/1 |
| MEMORY1 | 0/1 | 0/1 | 0/1 | 0/1 | 0/1 | 0/1 | 0/1 | 0/1 |
| MEMORY2 | 0/1 | 0/1 | 0/1 | 0/1 | 0/1 | 0/1 | 0/1 | 0/1 |
| MEMORY3 | 0/1 | 0/1 | 0/1 | 0/1 | 0/1 | 0/1 | 0/1 | 0/1 |

SEMICONDUCTOR DEVICE WITH TEMPORARY MEMORY CHIP AND METHOD FOR DRIVING THE SAME

CROSS-REFERENCE TO RELATED APPLICATIONS

The present application claims priority of Korean Patent Application No. 10-2015-0150145, filed on Oct. 28, 2015, which is incorporated herein by reference in its entirety.

BACKGROUND

1. Field

Exemplary embodiments of the present invention generally relate to a semiconductor design technology, and more particularly, to a semiconductor device and a method for driving the same.

2. Description of the Related Art

Semiconductor devices are being continuously developed to operate at higher speed and have higher integration. However, a heating problem of the semiconductor devices has not been resolved easily. As the semiconductor devices operate at high speed and are highly integrated, the heating problem may become more serious. When the semiconductor devices are heated, the performances of the semiconductor devices may get worse. Accordingly, when collateral functions are performed to compensate for the performance of the semiconductor devices, it may lead to some problems.

For example, heating of a memory device, such as a dynamic random access memory (DRAM), may result in loss of stored data Performing a refresh operation on a heated memory region at shorter time intervals may prevent the loss of data, but may also increase the power consumption of the memory device.

In a typical operation of a semiconductor memory device, when a memory request, such as a write operation or a read operation request is made, a corresponding memory region may be accessed and an operation corresponding to the memory request may be performed. So typically, heating may primarily occur in the memory region. When some memory regions among a plurality of memory regions included in a memory device are accessed repeatedly at high frequencies, heating in those memory regions may increase substantially. In addition, we have observed that when memory regions are disposed perpendicularly adjacent to each other included in memory devices where a plurality of chips are stacked are simultaneously accessed, the heating problem may be exacerbated.

SUMMARY

Various embodiments of the present invention are directed to a semiconductor device where heat generating conditions may be eased, and a method for driving the semiconductor device.

In accordance with an embodiment of the present invention, a semiconductor device includes: a first memory chip including a plurality of first memory regions; a temporary memory chip including a plurality of temporary memory regions; and a control chip suitable for accessing a first access target memory region among the plurality of first memory regions or a first temporary memory region among the plurality of temporary memory regions based on first access information and first temperature readout information corresponding to the plurality of first memory regions.

The control chip may include: a plurality of temperature sensors suitable for generating the first temperature readout information; and a memory scheduler suitable for accessing the first access target memory region or the first temporary memory region based on the first temperature readout information and the first access information.

The semiconductor device may further include: a second memory chip including a plurality of second memory regions one to one corresponding to the plurality of first memory regions, wherein the second memory chip is vertically stacked on the first memory chip, and wherein the memory scheduler accesses a second access target memory region among the plurality of second memory regions or a second temporary memory region among the plurality of temporary memory regions based on the first temperature readout information and second access information corresponding to plurality of the second memory regions.

The memory scheduler may include: a temperature table generation block suitable for generating a temperature table based on the first temperature readout information; a heat determination block suitable for determining a heating degree of the first access target memory region and a heating degree of the second access target memory region based on the temperature table; and a memory access control block suitable for accessing the first access target memory region or the first temporary memory region based on the first access information and a determination result of the heat determination block and accessing the second access target memory region or the second temporary memory region based on the second access information and the determination result of the heat determination block.

The semiconductor device may further include: a second memory chip including a plurality of second memory regions one to one corresponding to the plurality of first memory regions, wherein the second memory chip is vertically stacked on the first memory chip, and wherein the control chip accesses a second access target memory region among the plurality of second memory regions or a second temporary memory region among the plurality of temporary memory regions based on second access information and second temperature readout information corresponding to the plurality of second memory regions.

The first memory chip may include a plurality of first temperature sensors suitable for generating the first temperature readout information, and the second memory chip includes a plurality of second temperature sensors suitable for generating the second temperature readout information, and the control chip includes a memory scheduler suitable for accessing the first access target memory region or the first temporary memory region based on the first temperature readout information and the first access information and accessing the second access target memory region or the second temporary memory region based on the second temperature readout information and the second access information.

The memory scheduler may include: a temperature table generation block suitable for generating a temperature table based on the first temperature readout information and the second temperature readout information; a heat determination block suitable for determining a heating degree of the first access target memory region and a heating degree of the second access target memory region based on the temperature table; and a memory access control block suitable for accessing the first access target memory region or the first temporary memory region based on the first access information and a determination result of the heat determination block and accessing the second access target memory region or the second temporary memory region based on the second access information and the determination result of the heat determination block.

The first memory chip may include a plurality of first temperature sensing blocks suitable for generating first temperature sensing information corresponding to temperatures of the plurality of first memory regions.

The control chip may include: a plurality of temperature readout blocks suitable for generating the first temperature readout information based on the first temperature sensing information; a temperature table generation block suitable for generating a temperature table based on the first temperature readout information; a heat determination block suitable for determining a heating degree of the first access target memory region based on the temperature table; and a memory access control block suitable for accessing the first access target memory region or the first temporary memory region based on the first access information and a determination result of the heat determination block.

In accordance with another embodiment of the present invention, a semiconductor device includes: a first normal memory chip including a plurality of first memory regions; a second normal memory chip stacked vertically on the first normal memory chip and including a plurality of second memory regions; a temporary memory chip including a plurality of temporary memory regions; and a control chip suitable for accessing the first normal memory chip or the temporary memory chip based on whether, when one memory region among the plurality of the first memory regions is accessed, a second memory region vertically adjacent to the accessed first memory region among the plurality second memory regions is accessed.

The control chip may include: a temperature table generation block suitable for generating a temperature table based on first access information corresponding to the plurality of first memory regions and second access information corresponding to the plurality of second memory regions; a heat determination block suitable for determining whether the second memory region vertically adjacent to accessed first memory region is accessed based on the temperature table; and a memory access control block suitable for accessing the first normal memory chip or the temporary memory chip based on a determination result of the heat determination block.

In accordance with another embodiment of the present invention, a method for driving a semiconductor device includes: determining a heating degree of a first access target memory region among a plurality of first memory regions based on a temperature table when first access information corresponding to a first normal memory chip including the plurality of first memory regions among a plurality of normal memory chips is inputted; and accessing the first normal memory chip or a temporary memory chip based on a result of determining the heating degree of the first access target memory region.

The method may further include: generating the temperature table, wherein the temperature table may be generated based on temperature readout information for each of the plurality of first memory regions supplied from the plurality of normal memory chips or a control chip or generated based on access information for each of the plurality of first memory regions.

The method may further include: determining a heating degree of a neighboring memory region vertically adjacent to the first access target memory region based on the temperature table after the heating degree of the first access target memory region is determined, wherein the first normal memory chip or the temporary memory chip may be accessed based on a determination result of the heating degree of the first access target memory region and a determination result of the heating degree of the neighboring memory region.

The heating degree of the first access target memory region may be determined based on whether a neighboring memory region vertically adjacent to the first access target memory region is accessed.

The accessing of the first normal memory chip or the temporary memory chip may include performing a write operation for writing a write data in the first normal memory chip or the temporary memory chip.

The accessing of the first normal memory chip or the temporary memory chip may include: determining whether there is a sufficient storage space in the temporary memory chip; and storing the write data in the temporary memory chip when it is determined that there is sufficient storage space in the temporary memory chip and storing the write data in the temporary memory chip after securing the storage space when it is determined that there is not enough storage space in the temporary memory chip.

The accessing of the first normal memory chip or the temporary memory chip may include transmitting the write data written in the temporary memory chip to the first access target memory region during an idle period.

The accessing of the first normal memory chip or the temporary memory chip may include performing a read operation for reading a read data from the first normal memory chip or the temporary memory chip.

The accessing of the first normal memory chip or the temporary memory chip may include: checking whether the read data is stored in the temporary memory chip; reading the read data from the temporary memory chip when it is checked that the read data is stored in the temporary memory chip, or determining whether there is a sufficient storage space in the temporary memory chip when it is checked that the read data is not stored in the temporary memory chip; and reading the read data from the normal memory chip to store the read data in the temporary memory chip and reading the read data from the temporary memory chip when it is determined that there is sufficient storage space in the temporary memory chip, or reading the read data from the normal memory chip to store the read data in the temporary memory chip and reading the read data from the temporary memory chip after securing the storage space when it is determined that there is not enough storage space in the temporary memory chip.

DETAILED DESCRIPTION

Figure 1:
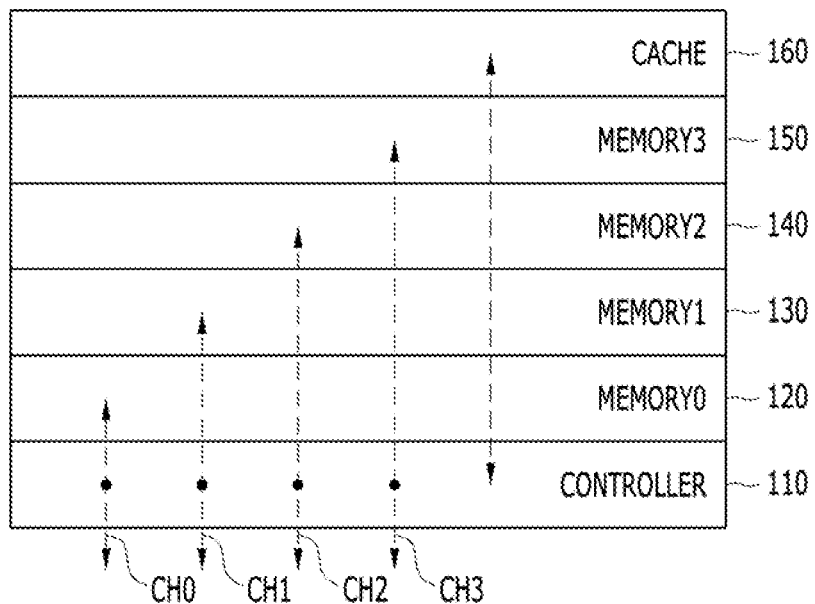
FIG. 1 is a configuration diagram illustrating a semiconductor device, according to an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete. Throughout the disclosure, like reference numerals refer to like parts throughout the various figures and embodiments of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items.

Referring to FIG. 1, a semiconductor device 100, according to an embodiment of the present invention, may include a control chip 110, a first normal memory chip 120, a second normal memory chip 130, a third normal memory chip 140, a fourth normal memory chip 150, and temporary memory chip 160, all of which are stacked vertically.

The control chip 110 may be located in the lowest portion of the semiconductor device 100. The control chip 110 may access the first to fourth normal memory chips 120 to 150 based on a memory request inputted from an external device (not illustrated). For example, the control chip 110 may transmit first to fourth read data supplied from the external device to the first to fourth normal memory chips 120 to 150 through first to fourth channels CH0 to CH3 based on the memory request. Also, for example, the control chip 110 may transmit first to fourth write data supplied from the first to fourth normal memory chips 120 to 150 to the external device through the first to fourth channels CH0 to CH3 based on the memory request.

The memory request may include write command information for controlling a write operation, read command information for controlling a read operation, first to fourth access information corresponding to the first to fourth normal memory chips 120 to 150 and so on. The first to fourth channels CH0 to CH3 may be independent channels that are electrically separated from each other. Each of the first to fourth channels CH0 to CH3 may include one or more data input/output paths.

The control chip 110 may access the temporary memory chip 160 instead of the first to fourth normal memory chips 120 to 150, depending on a degree of heating of the first to fourth normal memory chips 120 to 150. For example, in a case where a temperature of the first normal memory chip 120 is higher than a preset threshold temperature when the control chip 110 accesses the first normal memory chip 120 based on the memory request, the control chip 110 may access the temporary memory chip 160 instead of the first normal memory chip 120. The control chip 110 is described in detail below.

The first to fourth normal memory chips 120 to 150 may be stacked vertically on the control chip 110. When each of the first to fourth normal memory chips 120 to 150 is accessed by the control chip 110, the first to fourth normal memory chips 120 to 150 may perform the write operation or the read operation corresponding to the memory request. For example, the first normal memory chip 120 may store the first write data supplied from the first channel CH0 in a preset memory region during the write operation. Also, for example, the first normal memory chip 120 may read the first read data from the preset memory region and supply the first read data to the control chip 110 through the first channel CH0 during the read operation. Each of the first to fourth normal memory chips 120 to 150 may be or include a volatile memory chip, such as, for example, a dynamic random access memory (DRAM).

The temporary memory chip 160 may be stacked in the uppermost portion of the semiconductor device 100. When the temporary memory chip 160 is accessed by the control chip 110, the temporary memory chip 160 may perform the write operation or the read operation instead of the first to fourth normal memory chips 120 to 150. For example, the temporary memory chip 160 may store a write data supplied from an assigned path in a preset temporary memory region during the write operation. Also, for example, the temporary memory chip 160 may read a read data from the preset temporary memory region and supply the read data to the control chip 110 through the assigned path during the read operation. For example, the temporary memory chip 160 may be or include a cache memory chip. The temporary memory chip 160 may be or include a volatile memory chip or a non-volatile memory chip. The temporary memory chip 160 may include a volatile memory chip or a non-volatile memory chip in addition to the cache memory chip.

Figure 2:
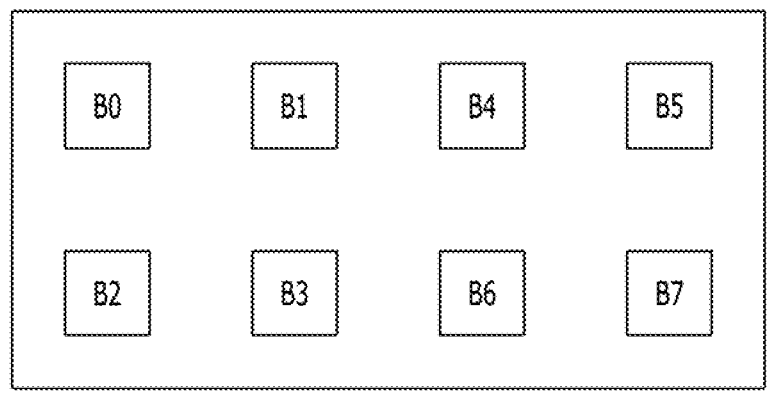
FIG. 2 is a configuration diagram illustrating first to fourth normal memory chips of the semiconductor device of FIG. 1, according to an embodiment of the present invention.

FIG. 2 is a diagram illustrating an example configuration for the first to fourth normal memory chips 120 to 150 shown in FIG. 1. Since the first to fourth normal memory chips 120 to 150 may have the same structure, FIG. 2 representatively shows only one normal memory chip.

Referring to FIG. 2, each of the first to fourth normal memory chips 120 to 150 may include first to eighth memory regions B0 to B7. Each of the first to eighth memory regions B0 to B7 may include a memory bank. Hereinafter, the first to eighth memory regions B0 to B7 are referred to as first to eighth memory banks B0 to B7. The first to eighth memory banks B0 to B7 may be accessed by the control chip 110 and, perform the write operation or the read operation. Although only first to eighth memory banks B0 to B7 are exemplarily described in the embodiment of the present invention, the invention is not limited thereto. Also, it is noted that the memory regions may be classified into any other suitable units, e.g., a bank group and the like.

Figures 3, 4:
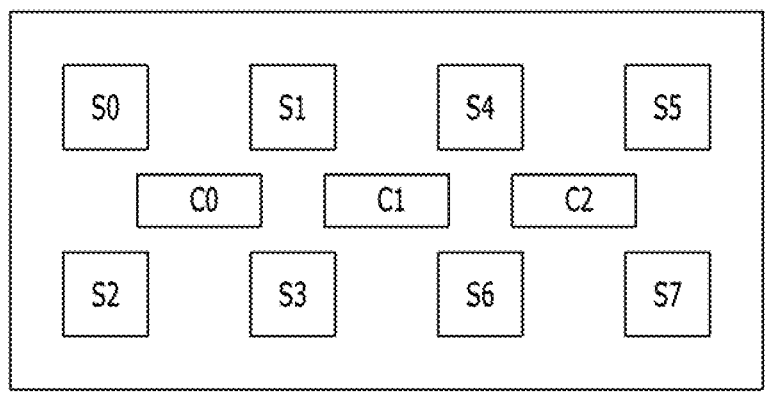
FIG. 3 is a configuration diagram illustrating a control chip of the semiconductor device of FIG. 1 according to an embodiment of the present invention.
FIG. 4 is a table illustrating temperatures generated from a temperature table generation block, according to an embodiment of the present invention.

Referring to FIG. 3, the control chip 110, according to an embodiment of the present invention may include first to eighth temperature sensors S0 to S7, and memory schedulers C0 to C2.

The first to eighth temperature sensors S0 to S7 may be disposed in the first to eighth banks B0 to B7 in one to one correspondence. The first to eighth temperature sensors S0 to S7 may sense temperatures of the vertically neighboring first to eighth banks B0 to B7 and generate first to eighth temperature readout information corresponding to the sensing results. For example, each of the first to eighth temperature sensors S0 to S7 may include a temperature sensing block (not illustrated) for generating an oscillating signal whose period may be varied with the sensed temperature and a temperature readout block (not illustrated) for detecting a temperature based on the oscillating signal.

The control chip 110 may include one or more memory schedulers C0 to C2. The memory schedulers C0 to C2 may include a temperature table generation block C0, a heat determination block and a memory access control block C2.

The temperature table generation block C0 may generate a temperature table corresponding to the first to eighth banks B0 to B7 based on the first to eighth temperature readout information. As shown in FIG. 4, the temperature table may include first to eighth temperature readout information T0 to T7 applied to the first to fourth normal memory chips 120 to 150 in common. In addition, the temperature table generation block C0 may update the temperature table at preset time intervals. For example, the temperature table generation block C0 may update the temperature table for each of a preset time periods. The temperature table generation block C0 may update the temperature table when the memory request is inputted.

The heat determination block C1 may determine a degree of heating of the first to eighth banks B0 to B7 based on the temperature table. For example, the heat determination block C1 may compare the temperature readout information in the temperature table with the threshold temperature to determine the degree of heating of the first to eighth banks B0 to B7 based on the comparison result when the memory request is inputted.

The memory access control block C2 may access at least one of the first to fourth normal memory chips 120 to 150 and the temporary memory chip 160 based on a determination result of the heat determination block C1 and the first to fourth access information. Each of the first to fourth access information may include a chip identification code for identifying the first to fourth normal memory chips 120 to 150, a bank address for selecting the first to eighth banks B0 to B7 and so on. For example, when a memory request is received which includes the first access information, the memory access control block C2 may determine a temperature of an access target bank B# among the first to eighth banks B0 to B7 included in the first normal memory chip 120 based on the determination result. When the temperature is lower than a threshold value, the memory access control block C2 may access the first normal memory chip 120. However, when the temperature is higher than the threshold value, the memory access control block C2 may access the temporary memory chip 160.

The memory access control block C2 may transmit the write data written in the temporary memory chip 160 during the write operation, to a corresponding normal memory chip among the first to fourth normal memory chips 120 to 150 during an idle period. The idle period may be a period other than an active period where the first to fourth normal memory chips 120 to 150 are being accessed.

Although not illustrated, the temporary memory chip 160 shown in FIG. 1 may include a plurality of temporary memory regions. The temporary memory regions may be formed to have the same number as the first to eighth banks B0 to B7, or may be formed more or less than eight regions. The temporary memory regions may be accessed under a control of the control chip 110 and perform the write operation or the read operation instead of the first to eighth banks B0 to B7. In a case where there is not enough storage space when the write operation or the read operation is performed, the temporary memory chip 160 may transmit a portion of data previously stored, to the first to fourth normal memory chips 120 to 150 to secure the storage space.

Hereinafter, an operation of the semiconductor device 100 having the aforementioned structure is described with reference to FIGS. 5 to 7.

Figure 5:
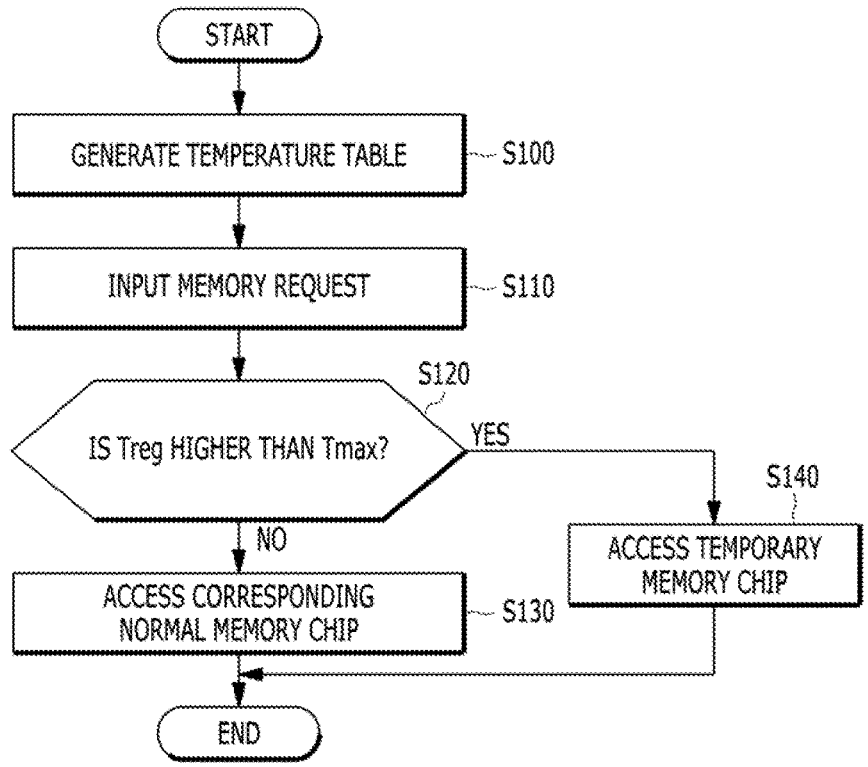
FIG. 5 is a flow chart illustrating a method for driving a semiconductor device, according to an embodiment of the present invention.

Referring to FIG. 5, a method for driving the semiconductor device 100, according to an embodiment of the present invention, may include generating the temperature table according to step S100, inputting a memory request, e.g. inputting one or more access information among the first to fourth access information, according to step S110, determining a degree of heating of Access target bank B# based on the temperature table according to step S120, and accessing one or more chips among the first to fourth normal memory chips 120 to 150 and the temporary memory chip 160 based on the determination result according to steps S130 and S140.

The generating of the temperature table according to step S100 may be carried out by the control chip 110. For example, the temperature table generation block C0 may receive the first to eighth temperature readout information T0 to T7 corresponding to each of the temperatures of the first to eighth banks B0 to B7 from the first to eighth temperature sensors S0 to S7. In addition, the temperature table generation block C0 may generate the temperature table including the temperatures of the first to eighth banks B0 to B7 based on the first to eighth temperature readout information T0 to T7.

The inputting of the access information according to step S110 may be carried out by the external device. Hereinafter, it is described as an example that the first access information corresponding to the first normal memory chip 120 may be inputted. The first access information may include a chip identification code corresponding to the first normal memory chip 120, a bank address corresponding to Access target bank B# among the first to eighth banks B0 to B7 included in the first normal memory chip 120 and so on.

The determination of the degree of heating of Access target bank B# according to step S120 may be carried out by the control chip 110. For example, the heat determination block. C1 may determine the degree of heating of Access target bank B# by comparing a temperature Treq of Access target bank B# with a preset threshold temperature Tmax based on the temperature table.

Accessing of one or more chips among the first to fourth normal memory chips 120 to 150 and the temporary memory chip 160 according to steps S130 and S140 may include accessing the first normal memory chip 120 according to step S130 and accessing the temporary memory chip 160 according to step S140.

Accessing of the first normal memory chip 120 according to step S130 may be carried out by the control chip 110. For example, the memory access control block, C2 may access the first normal memory chip 120 when the temperature Treq of Access target bank B# is lower than the threshold temperature Tmax as determined of the heat determination block C1. In other words, the memory access control block C2 may access the first normal memory chip 120 when the degree of heating of Access target bank B# is generally good. In this case, the first normal memory chip 120 may store the first write data transmitted through the first channel CH0 in Access target bank B#, or may read the first read data from Access target bank B# to output the first read data to the control chip 110 through the first channel CH0.

Accessing of the temporary memory chip 160 according to step S140 may be carried out by the control chip 110. For example, the memory access control block C2 may access the temporary memory chip 160 when the temperature Treq of Access target bank B# is higher than the threshold temperature Tmax as determined of the heat determination block C1. In other words, the memory access control block C2 may access the temporary memory chip 160 instead of the first normal memory chip 120 when the degree of heating of Access target bank B# is poor. In this case, the temporary memory chip 160 may store the first write data transmitted through the assigned path in the preset temporary memory region. It is desirable that the preset temporary memory region is not vertically adjacent to Access target bank B#. The temporary memory chip 160 may read the first read data from the preset temporary memory region to output the first read data to the control chip 110 through the assigned path.

Figure 6:
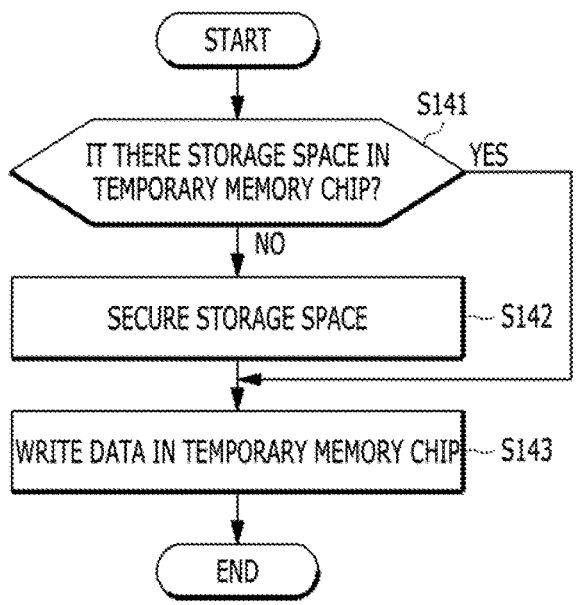
FIGS. 6 and 7 are flow charts illustrating a method for accessing a temporary memory chip, according to an embodiment of the present invention.

FIG. 6 is a flow chart describing a write operation according to step S140.

Referring to FIG. 6, the write operation may include determining whether there is a sufficient storage space in the temporary memory chip 160 according to step S141, securing the storage space when there is not enough storage space in the temporary memory chip 160 according to step S142, and storing the first write data in the secured storage space of the temporary memory chip 160 according to step S143.

According to step S141, it may be determined whether another data (hereinafter, referred to as a "previous data") is stored in the preset temporary memory region. When the previous data is stored in the preset temporary memory region, an operation to secure the storage space may be performed. However, when the previous data is not stored in the preset temporary memory region the operation to secure the storage space may not be performed.

The step S142 may include transmitting the previous data stored in the preset temporary memory region to a corresponding normal memory chip among the first to fourth normal memory chips 120 to 150.

According to step S143, the first write data may be stored in the preset temporary memory region.

Figure 7:
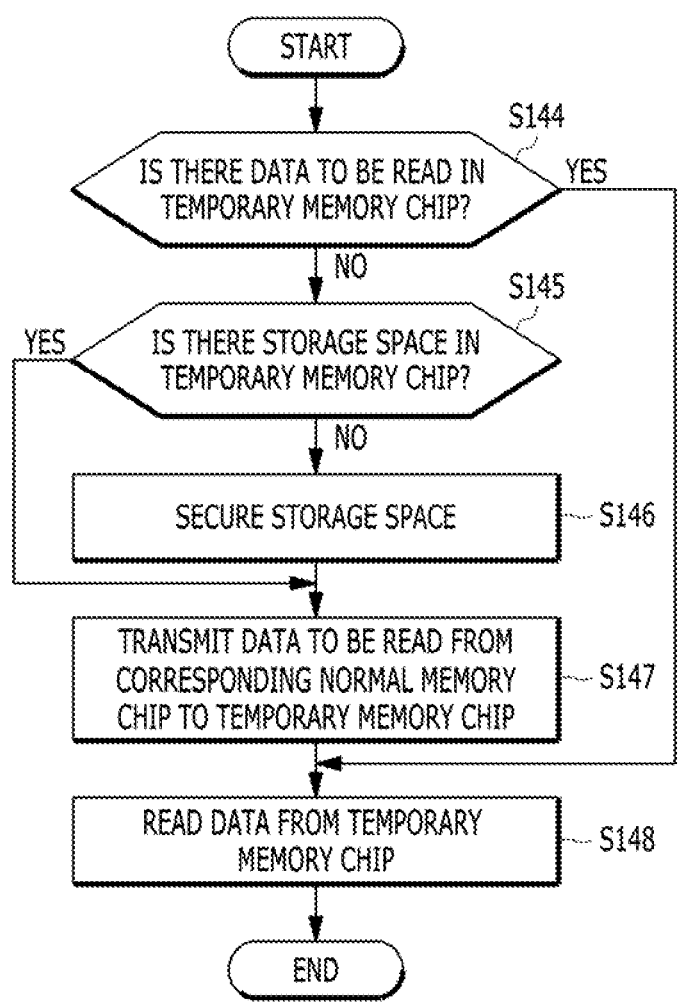

FIG. 7 is a flow chart describing the read operation according to step S140.

Referring to FIG. 7, the read operation of the temporary memory chip 160 may include checking whether the first read data corresponding to the first access information is stored in the temporary memory chip 160 according to step S144, determining whether there is sufficient storage space in the temporary memory chip 160 when the first read data is not stored in the temporary memory chip 160 according to step S145, securing the storage space when there is not enough storage space in the temporary memory chip 160 according to step S146, reading the first read data from the first normal memory chip 120 to store the first read data in the temporary memory chip 160 according to step S147, and reading the first read data from the temporary memory chip 160 and transferred to the control chip 110 through the first channel CH0 according to step S148.

The step S146 may include transmitting the previous data stored in the preset temporary memory region to a corresponding normal memory chip among the first to fourth normal memory chips 120 to 150.

According to step S144, the first read data may be read from the temporary memory chip 160 and transferred to the control chip 110 through the first channel CH0 when the first read data is stored in the temporary memory chip 160.

According to step S145, the first read data may be read from the first normal memory chip 120 and stored in the temporary memory chip 160 without needing to secure the storage space when there is sufficient storage space in the temporary memory chip 160.

In the method for driving the semiconductor device 100 as described above, two or more access information may be simultaneously inputted. For example, a first and a second access information may be simultaneously inputted. In this case, in an embodiment, the semiconductor device 100 may carry out the aforementioned steps S100 to S140 based on the first access information first. Then, subsequently, after the steps S100 to S140 based on the first access information have been completed, the semiconductor device 100 may carry out the steps S100 to S140 based on the second access information.

Figure 8:
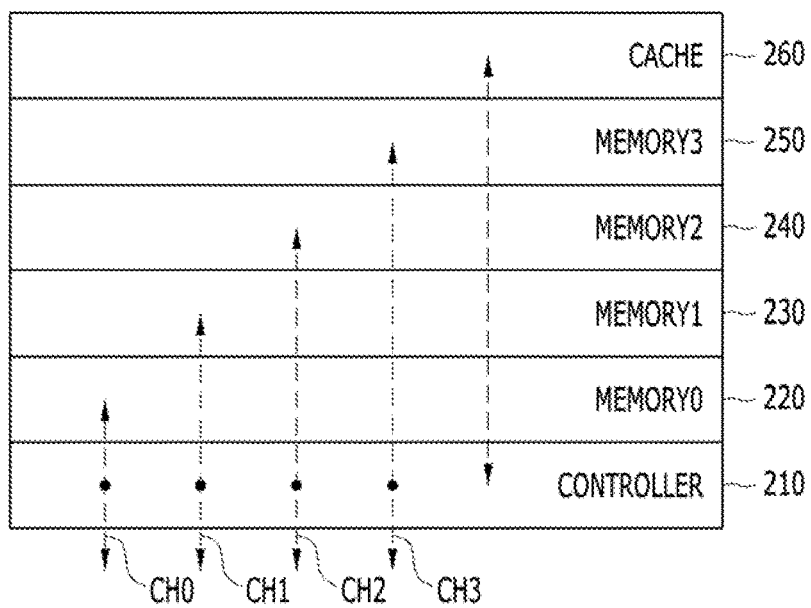
FIG. 8 is a configuration diagram illustrating a semiconductor device, according to another embodiment of the present invention.

Referring to FIG. 8, a semiconductor device 200 according to another embodiment of the present invention may include a control chip 210, a first normal memory chip 220, a second normal memory chip 230, a third normal memory chip 240, a fourth normal memory chip 250, and a temporary memory chip 260.

The semiconductor device 200 may be similar to the semiconductor device 100 as described above. However, the semiconductor device 200 is different from the semiconductor device 100 in that the semiconductor device 200 may include first to eighth temperature sensors S0 to S7 in each of the first to fourth normal memory chips 220 to 250. Hereinafter, descriptions focusing on the foregoing different structure are provided.

Figure 9:
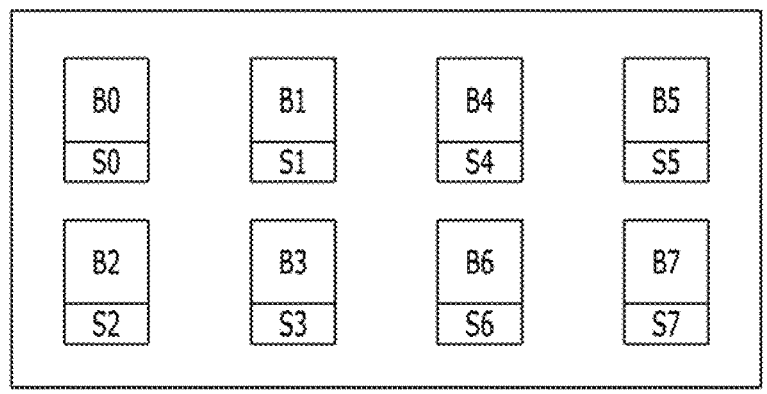
FIG. 9 is a configuration diagram illustrating first to fourth normal memory chips of the semiconductor device of FIG. 8, according to an embodiment of the present invention.

FIG. 9 is a diagram illustrating an example configuration for the first to fourth normal memory chips 220 to 250 shown in FIG. 8. Since the first to fourth normal memory chips 220 to 250 may have the same structure, FIG. 9 representatively shows only one normal memory chip.

Referring to FIG. 9, each of the first to fourth normal memory chips 220 to 250 may include first to eighth memory banks B0 to B7 and the first to eighth temperature sensors S0 to S7.

Since the first to eighth memory banks B0 to B7 are substantially identical to the first to eighth memory banks B0 to B7 as described earlier, detailed descriptions thereof are omitted.

The first to eighth temperature sensors S0 to S7 may supply first to eighth temperature readout information corresponding to temperatures of the first to eighth memory banks B0 to B7 for each of the normal memory chips to the control chip 210. Since the first to eighth temperature sensors S0 to S7 are included in each of the first to fourth normal memory chips 220 to 250, the reliability of the first to eighth temperature readout information for each of the normal memory chips supplied to the control chip 210 may be improved. The first to eighth temperature sensors S0 to S7 may have the same structure as the first to eighth temperature sensors S0 to S7 included in the aforementioned one embodiment of the present invention. For example, the first to eighth temperature sensors S0 to S7 may include a temperature sensing block (not illustrated) for generating an oscillating signal whose period may be varied with temperature and a temperature readout block (not illustrated) for detecting a temperature based on the oscillating signal.

Figure 10:
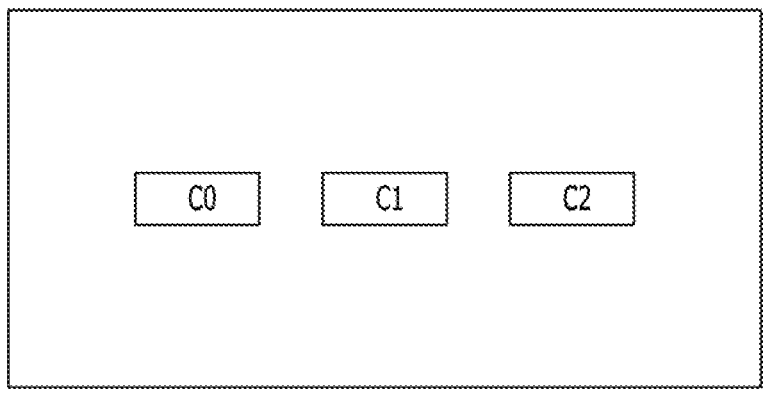
FIG. 10 is a configuration diagram illustrating a control chip of the semiconductor device of FIG. 8, according to an embodiment of the present invention.

Referring to FIG. 10, a control chip 210 according to another embodiment of the present invention may include memory schedulers C0 to C2. For example, the memory schedulers C0 to C2 may include a temperature table generation block C0, a heat determination block C1, and a memory access control block C2.

Figures 11, 12:
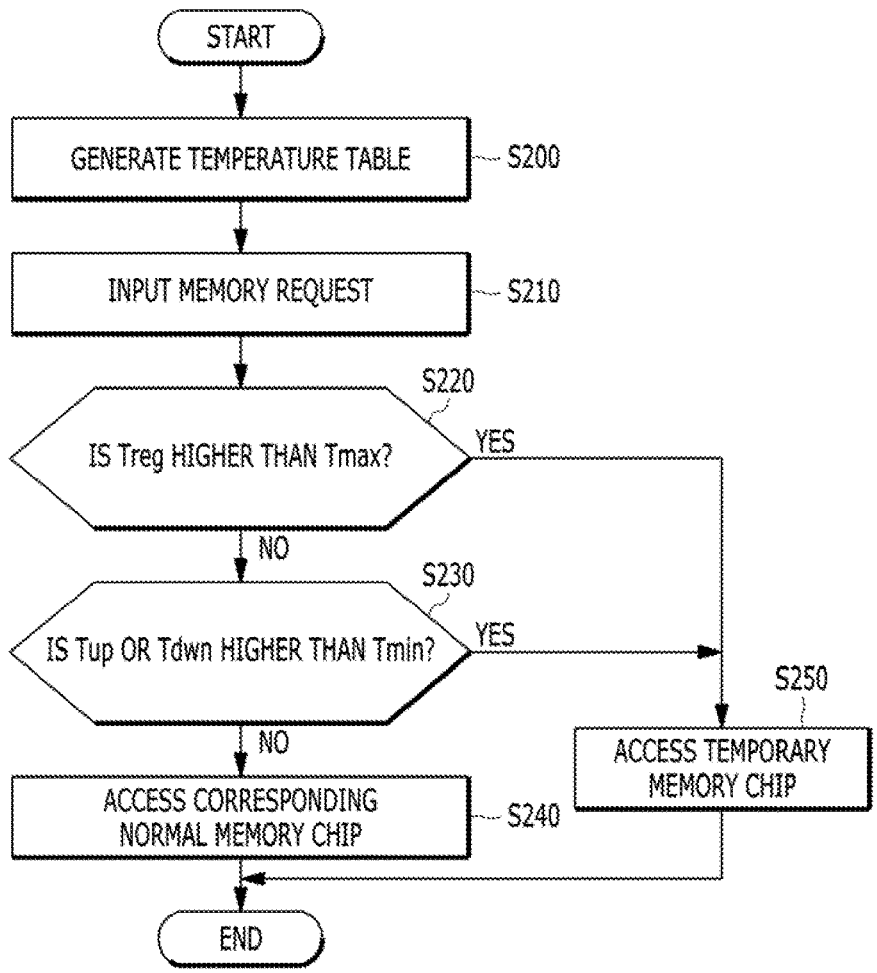
FIG. 11 is a table illustrating temperatures generated from a temperature table generation block, according to another embodiment of the present invention.
FIG. 12 is a flow chart illustrating a method for driving a semiconductor device, according to another embodiment of the present invention.

The temperature table generation block C0 may generate a temperature table corresponding to the first to eighth banks B0 to B7 based on the first to eighth temperature readout information. As shown in FIG. 11, the temperature table may include first to eighth temperature readout information T0 to T7 supplied from the first normal memory chip 220, first to eighth temperature readout information T10 to T17 supplied from the second normal memory chip 230, first to eighth temperature readout information T20 to T27 supplied from the third normal memory chip 240, and first to eighth temperature readout information T30 to T37 supplied from the fourth normal memory chip 250. In addition, the temperature table generation block C0 may update the temperature table at preset time intervals. For example, the temperature table generation block C0 may update the temperature table for each of preset periods. The temperature table generation block C0 may update the temperature table when the memory request is inputted.

The heat determination block C1 may determine a degree of heating of an access target bank B# based on the temperature table. For example, the heat determination block C1 may compare the temperature readout information in the temperature table with a preset threshold temperature to determine the degree of heating of Access target bank B# based on the comparison result when the memory request is inputted.

The memory access control block C2 may access at least one of the first to fourth normal memory chips 220 to 250 and the temporary memory chip 260 based on determination information outputted from the heat determination block C1 and the first to fourth access information. Each of the first to fourth access information may include a chip identification code for identifying the first to fourth normal memory chips 220 to 250, a bank address for selecting the first to eighth banks B0 to B7 and so on. For example, when the memory request including the first access information is inputted, the memory access control block C2 may determine a temperature of Access target bank B# among the first to eighth banks B0 to B7 included in the first normal memory chip 220 based on the determination information. When the temperature is lower than a threshold value, the memory access control block. C2 may access the first normal memory chip 220. However, when the temperature is higher than the threshold value, the memory access control block C2 may access the temporary memory chip 260.

The memory access control block C2 may transmit the write data written in the temporary memory chip 260 during the write operation, to a corresponding normal memory chip among the first to fourth normal memory chips 220 to 250 during an idle period. The idle period may include a period other than an active period where the first to fourth normal memory chips 220 to 250 may be accessed.

Hereinafter, an operation of the semiconductor device 200 having the aforementioned structure is described with reference to FIGS. 12 to 14.

FIG. 12 is a flow chart illustrating a method for driving the semiconductor device 200 shown in FIG. 8.

The method for driving the semiconductor device 200 is similar to the method for driving the semiconductor device 100 as described above. However, the method for driving the semiconductor device 200 may further include additionally determining a degree of heating of a bank vertically adjacent to Access target bank B# (hereinafter, referred to as a "neighboring bank" according to step S230 after determining a degree of heating of Access target bank B# according to step S220. This additional determination of the degree of heating of a neighboring bank according to step S230 is described further below.

Access target bank B# may be a single bank included in the first normal memory chip 220. The neighboring bank may be included in the second normal memory chip 230 and may be vertically adjacent to Access target bank B#.

Referring to FIG. 12, the determination of the degree of heating of the neighboring bank according to step S230 may be carried out by the control chip 210. The control chip 210 may determine the degree of heating of the neighboring bank based on the first access information and the temperature table. For example, the heat determination block C1 may determine the degree of heating of the neighboring bank by comparing a temperature Tup of the neighboring bank with a preset second threshold temperature Tmin based on the temperature table.

According to step S230, the memory access control block C2 may access the first normal memory chip 220 when the temperature Tup of the neighboring bank is lower than the second threshold temperature Tmin as determined by the heat determination block C1. When the temperature Tup of the neighboring bank is higher than the second threshold temperature Tmin, the memory access control block C2 may access the temporary memory chip 260.

Figure 13:
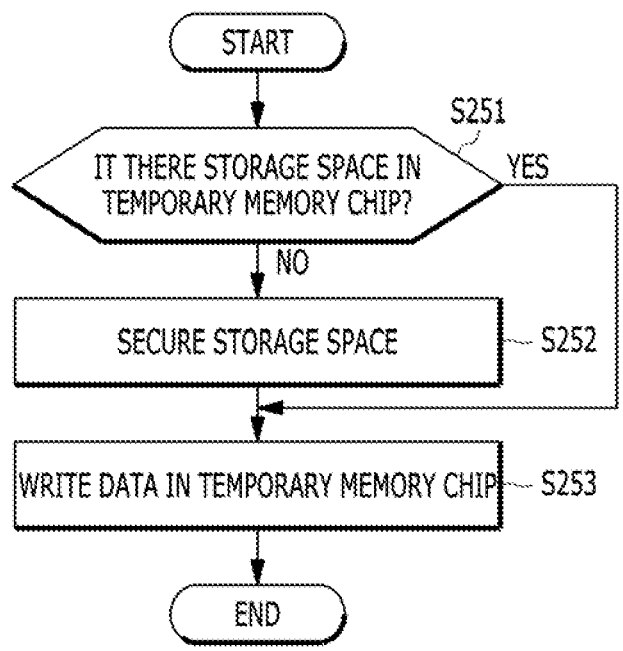
FIGS. 13 and 14 are flow charts illustrating a method for accessing a temporary memory chip, according to another embodiment of the present invention.
Figure 14:
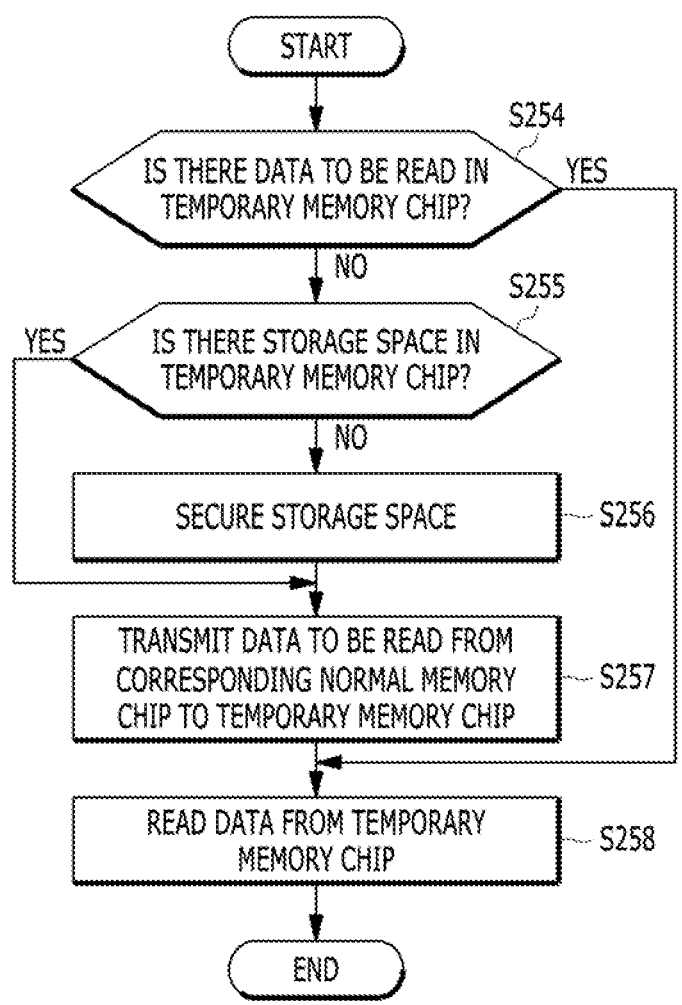

Although FIGS. 13 and 14 are flow charts describing a write operation and a read operation according to step S250 where the temporary memory chip 260 is accessed, detailed descriptions thereof are omitted because the operations are substantially identical to the operations as described above with reference to FIGS. 6 and 7.

Figure 15:
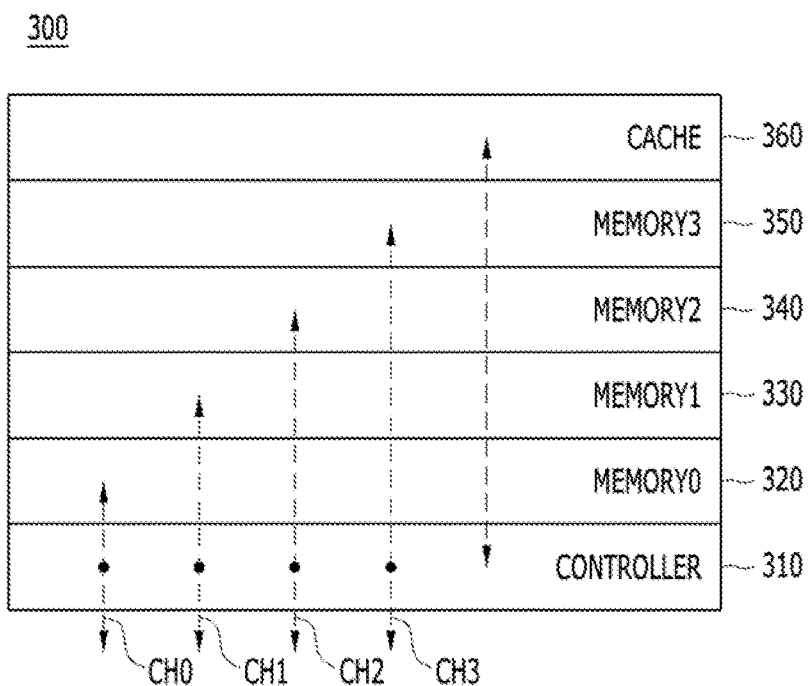
FIG. 15 is a configuration diagram illustrating a semiconductor device according to yet another embodiment of the present invention.

Referring to FIG. 15, a semiconductor device 300, according to yet another embodiment of the present invention, may include a control chip 310, a first normal memory chip 320, a second normal memory chip 330, a third normal memory chip 340, a fourth normal memory chip 350, and a temporary memory chip 360.

The semiconductor device 300 may be substantially similar to the semiconductor devices 100 and 200 as described above. However, the semiconductor device 300 is different from the semiconductor devices 100 and 200, in that, in the semiconductor device 300, some of the internal components of each of first to eighth temperature sensors S00/S01 to S70/S71 are formed in each of the first to fourth normal memory chips 320 to 350 and the remaining internal components are formed in the control chip 210. For example, each of the first to eighth temperature sensors S00/S01 to S70/S71 may include temperature sensing blocks S00 to S70 and temperature readout blocks S01 to S71. Hereinafter, descriptions focusing on the foregoing different structure are provided.

Figure 16:
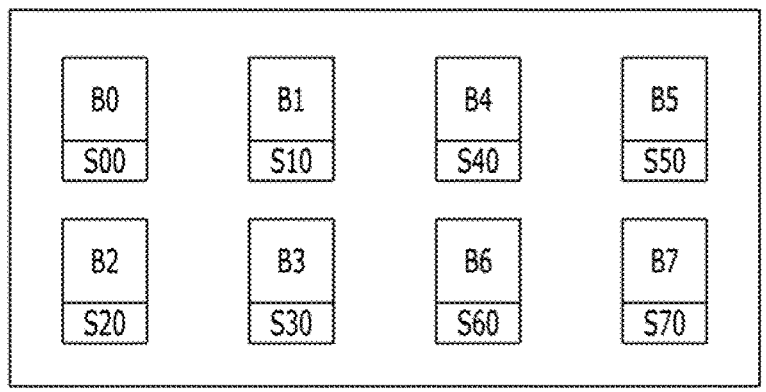
FIG. 16 is a configuration diagram illustrating first to fourth normal memory chips of the semiconductor device of FIG. 15, according to an embodiment of the present invention.

FIG. 16 is a diagram illustrating an example configuration for the first to fourth normal memory chips 320 to 350 shown in FIG. 15. Since the first to fourth normal memory chips 320 to 350 may have the same structure FIG. 16 representatively shows only one normal memory chip.

Referring to FIG. 16, each of he first to fourth normal memory chips 320 to 350 may include first to eighth memory banks B0 to B7 and the first to eighth temperature sensing blocks S00 to S70.

Since the first to eighth memory banks B0 to B7 are substantially identical to the first to eighth memory banks B0 to B7 described in the aforementioned another embodiment of the present invention with reference to FIG. 9, detailed descriptions thereof are omitted.

The first to eighth temperature sensing blocks S00 to S70 may supply first to eighth temperature sensing information corresponding to temperatures of the first to eighth memory banks B0 to B7 for each of the normal memory chips to the control chip 310. For example, the first to eighth temperature sensing blocks S00 to S70 may generate an oscillating signal whose period may be varied with temperature as the first to eighth temperature sensing information. Since the first to eighth temperature sensing blocks S00 to S70 are included in each of the first to fourth normal memory chips 320 to 350 the reliability of the first to eighth temperature sensing information supplied to the control chip 310 by normal memory chips may be improved.

Figures 17, 18:
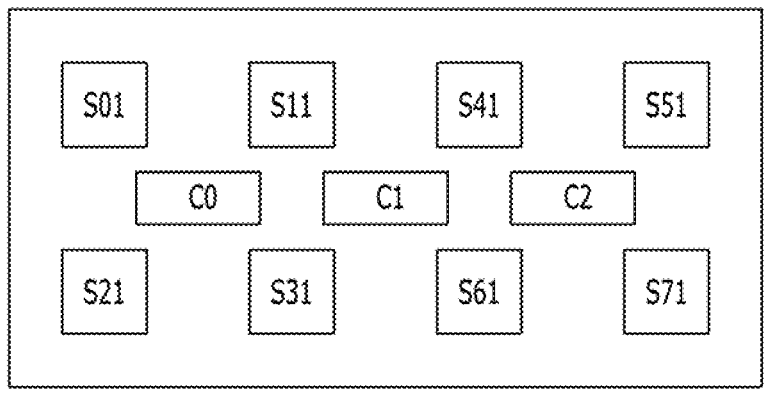
FIG. 17 is a configuration diagram illustrating a control chip of the semiconductor device of FIG. 15, according to an embodiment of the present invention.
FIG. 18 is a table illustrating temperatures generated from a temperature table generation block, according to yet another embodiment of the present invention.

Referring to FIG. 17, a control chip 310 according to yet another embodiment of the present invention may include first to eighth temperature readout block S01 to S71, a temperature table generation block C0, a heat determination block C1 and a memory access control block C2.

The first to eighth temperature readout block S01 to S71 may generate first to eighth temperature readout information corresponding to the first to eighth temperature sensing information supplied by normal memory chips. For example, each of the first to eighth temperature readout block S01 to S71 may readout the temperatures of the first to eighth banks B0 to B7 for each of the normal memory chips based on the oscillating signal to generate the first to eighth temperature readout information corresponding to the readout result. The first to eighth temperature readout block S01 to S71 may be included in each of the first to fourth normal memory chips 320 to 360. Or, the first to eighth temperature readout block S01 to S71 may be included in the first to fourth normal memory chips 320 to 360 in common.

Since the temperature table generation block C0, the heat determination block C1 and the memory access control block C2 are the same as described above with reference to FIG. 10, detailed descriptions thereof are omitted. Since a temperature table according to yet another embodiment of the present invention, as shown in FIG. 18 is also the same as described above with reference to FIG. 11, detailed descriptions thereof are also omitted.

Figure 19:
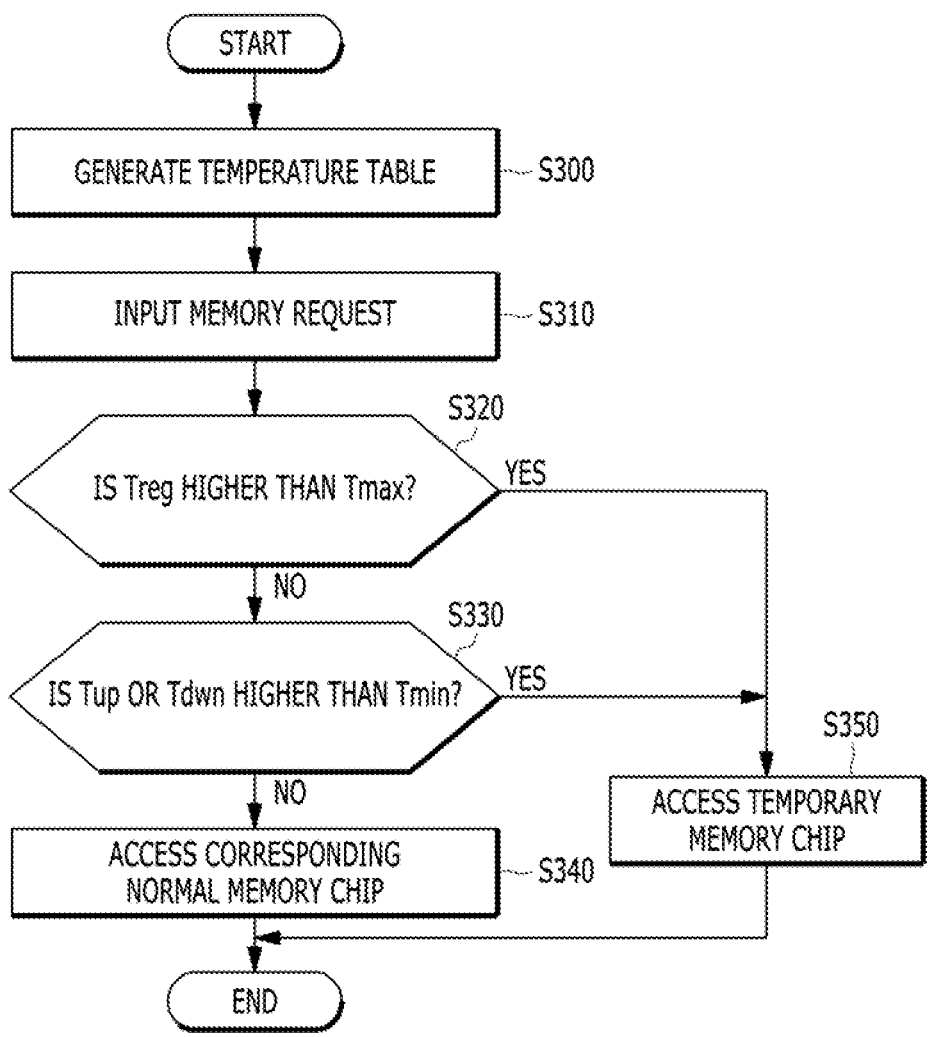
FIG. 19 is a flow chart illustrating a method for driving a semiconductor device, according to yet another embodiment of the present invention.
Figure 20:
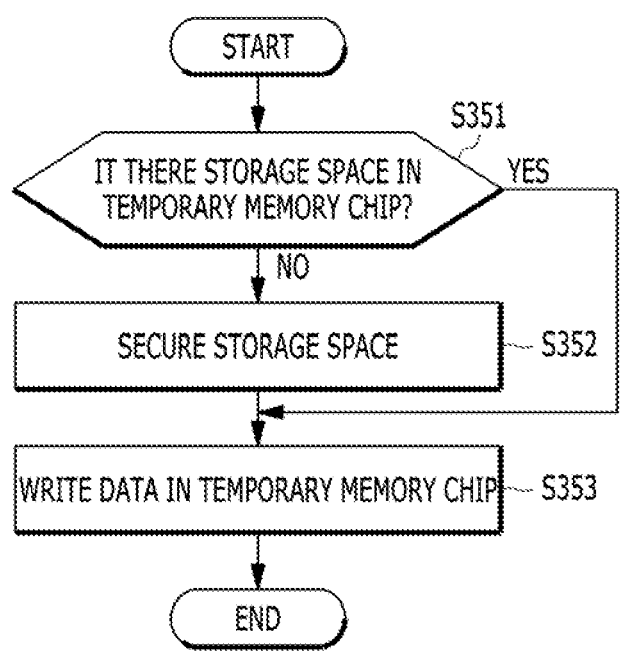
FIGS. 20 and 21 are flow charts illustrating a method for accessing a temporary memory chip, according to yet another embodiment of the present invention.
Figure 21:
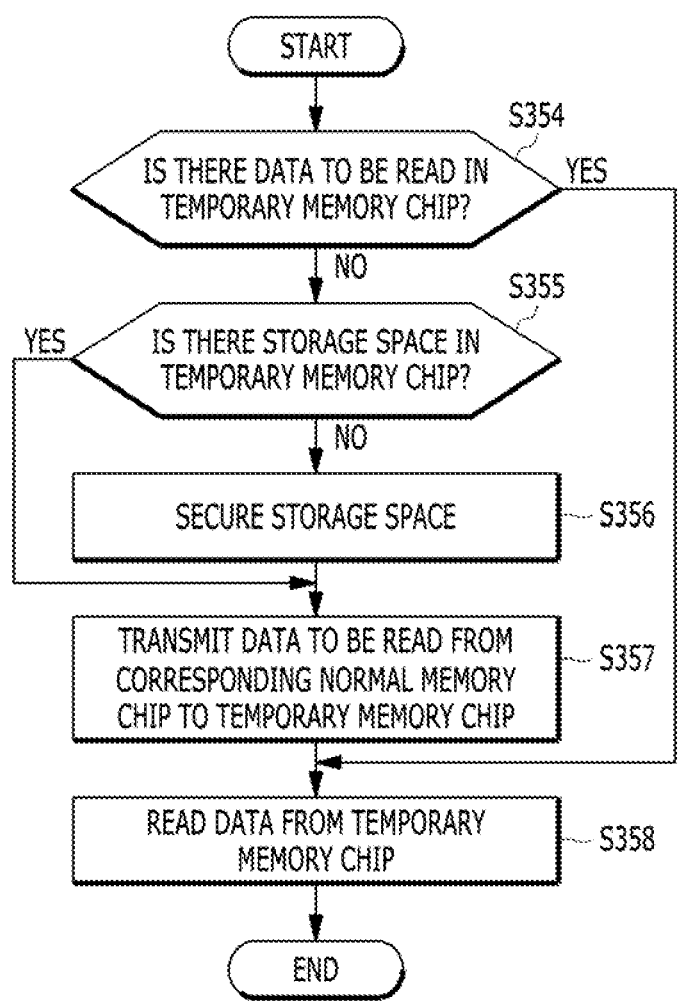

The operation of the semiconductor device 300 having the aforementioned structure is illustrated in FIGS. 19 to 21. It is noted, that in this embodiment the temperature sensor may be formed to be included in both of the normal memory chip and the control chip. Moreover, the operation of the semiconductor device 300 according to this embodiment of the present invention may be the same as the operation of the semiconductor device 200 described earlier, hence, detailed description of the operation of device 300 based on FIGS. 19 to 21 will not be repeated.

Figure 22:
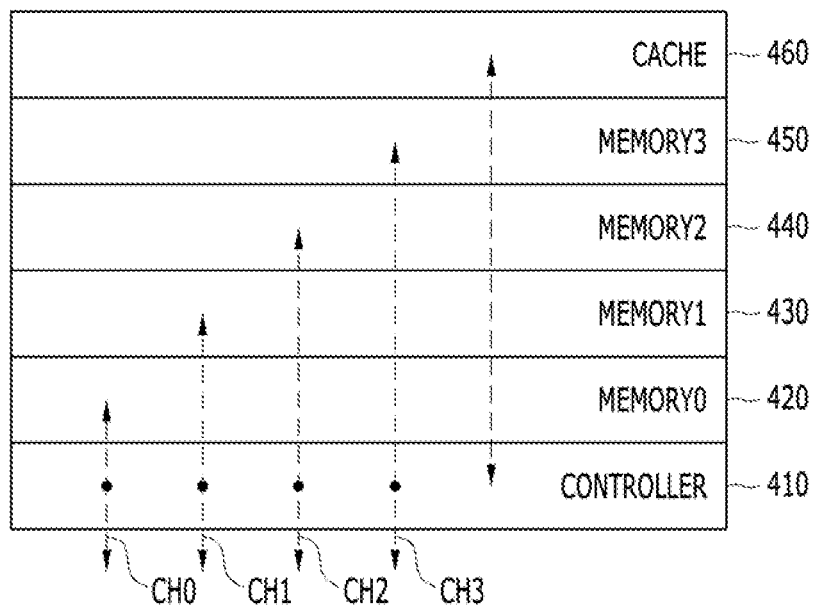
FIG. 22 is a configuration diagram illustrating a semiconductor device, according to yet another embodiment of the present invention.

Referring to FIG. 22, a semiconductor device 400, according to yet another embodiment of the present invention, may include a control chip 410, a first normal memory chip 420, a second normal memory chip 430, a third normal memory chip 440, a fourth normal memory chip 450, and a temporary memory chip 460.

The semiconductor device 400 may be substantially similar to the semiconductor devices 100, 200 and 300 as described above. However, the semiconductor device 400 is different from the semiconductor devices 100, 200 and 300, in that the semiconductor device 400 does not include first to eighth temperature sensors. In other words, in this embodiment of the present invention, temperatures for each of the banks may be indirectly measured without temperature sensors so that a degree of heating of an access target bank B# may be determined.

Figure 23:
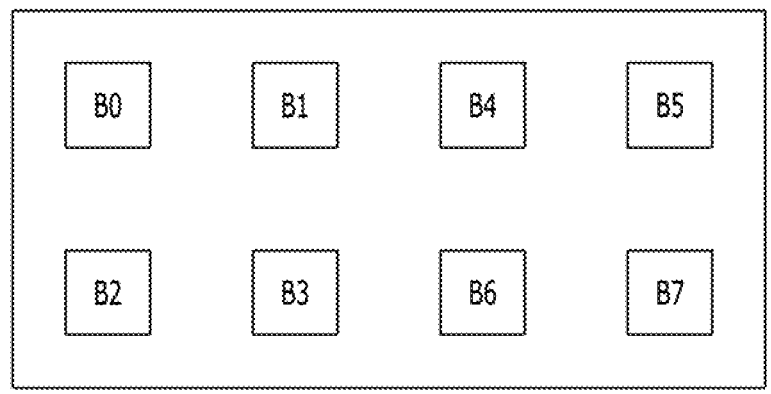
FIG. 23 is a configuration diagram illustrating first to fourth normal memory chips of the semiconductor device of FIG. 22, according to an embodiment of the present invention.

FIG. 23 is a diagram illustrating an example configuration for the first to fourth normal memory chips 420 to 450 shown in FIG. 22. Since the first to fourth normal memory chips 420 to 450 may have the same structure, FIG. 2 representatively shows only one normal memory chip.

Referring to FIG. 23, each of the first to fourth normal memory chips 420 to 450 may include first to eighth memory banks B0 to B7. Since the first to eighth memory banks B0 to B7 may be substantially identical to the first to eighth memory banks B0 to B7 as described in the aforementioned one embodiment of the present invention with reference to FIG. 2, detailed descriptions thereof are omitted.

Figures 24, 25:
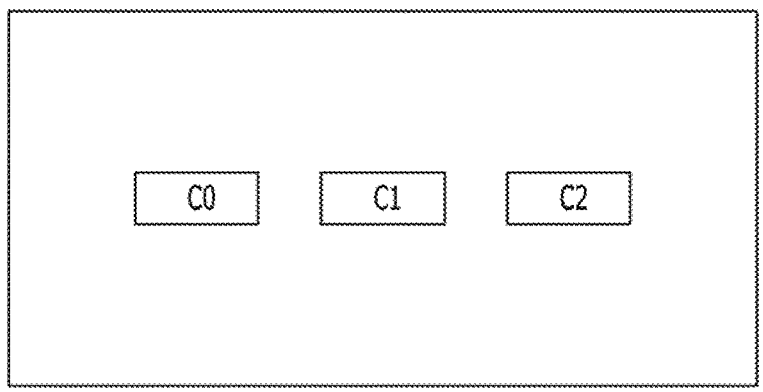
FIG. 24 is a configuration diagram illustrating a control chip of the semiconductor device of FIG. 22, according to an embodiment of the present invention.
FIG. 25 is a table illustrating temperatures generated from a temperature table generation block, according to yet another embodiment of the present invention.

Referring to FIG. 24, a control chip 410 according to the other embodiment of the present invention may include memory schedulers C0, C1 and C2. For example, the memory schedulers C0 to C2 may include a temperature table generation block C0, a heat determination block C1, and a memory access control block C2.

The temperature table generation block C0 may generate a temperature table indicating whether the first to eighth banks B0 to B7 included each of the first to fourth normal memory chips 420 to 450 are accessed based on first to fourth access information. For example, referring to FIG. 25, the temperature table generation block C0 may set first temperature readout information corresponding to the first bank B0 of the second normal memory chip 430 to "1", based on the second access information when the first bank B0 of the second normal memory chip 430 is accessed. The temperature table generation block C0 may set the first temperature readout information to "0", when Access state of the first bank B0 terminates.

Each of the first to fourth access information may include a chip identification code for identifying the first to fourth normal memory chips 420 to 450, a bank address for selecting the first to eighth banks B0 to B7 and so on.

The heat determination block C1 may determine a degree of heating of the first to eighth banks B0 to B7 included in each of the first to fourth normal memory chips 420 to 450 based on the first to fourth access information and the temperature table. If the first bank B0 of the first normal memory chip 420 is accessed, the heat determination block C1 may indirectly determine that the degree of heating of the first bank B0 of the first normal memory chip 420 is bad when it is identified from the temperature table that the first temperature readout information corresponding to the first bank B0 of the second normal memory chip 430 is "1". The heat determination block C1 may indirectly determine that the degree of heating of the first bank B0 of the first normal memory chip 420 is good when it is identified from the temperature table that the first temperature readout information corresponding to the first bank B0 of the second normal memory chip 430 is "0".

The memory access control block C2 may access at least one of the first to fourth normal memory chips 420 to 450 and the temporary memory chip 460 based on the first to fourth access information and the determination result of the heat determination block C1. If the first bank B0 of the first normal memory chip 420 is accessed, the memory access control block C2 may access the temporary memory chip 460 when it is determined that the degree of heating of the first bank B0 of the first normal memory chip 420 is bad based on the determination result. The memory access control block C2 may access the first normal memory chip 420 when it is determined that the degree of heating of the first bank B0 of the first normal memory chip 420 is good.

In addition, the memory access control block C2 may transmit a write data written in the temporary memory chip 460 during a write operation, to a corresponding normal memory chip among the first to fourth normal memory chips 420 to 450 during an idle period. The idle period may include a period other than an active period where the first to fourth normal memory chips 420 to 450 are accessed.

Figure 27:
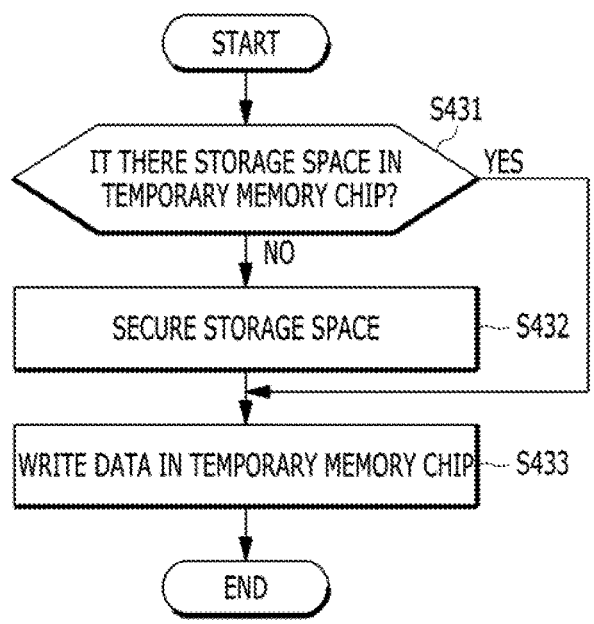
FIGS. 27 and 28 are flow charts illustrating a method for accessing a temporary memory chip according to yet another embodiment of the present invention.
Figure 28:
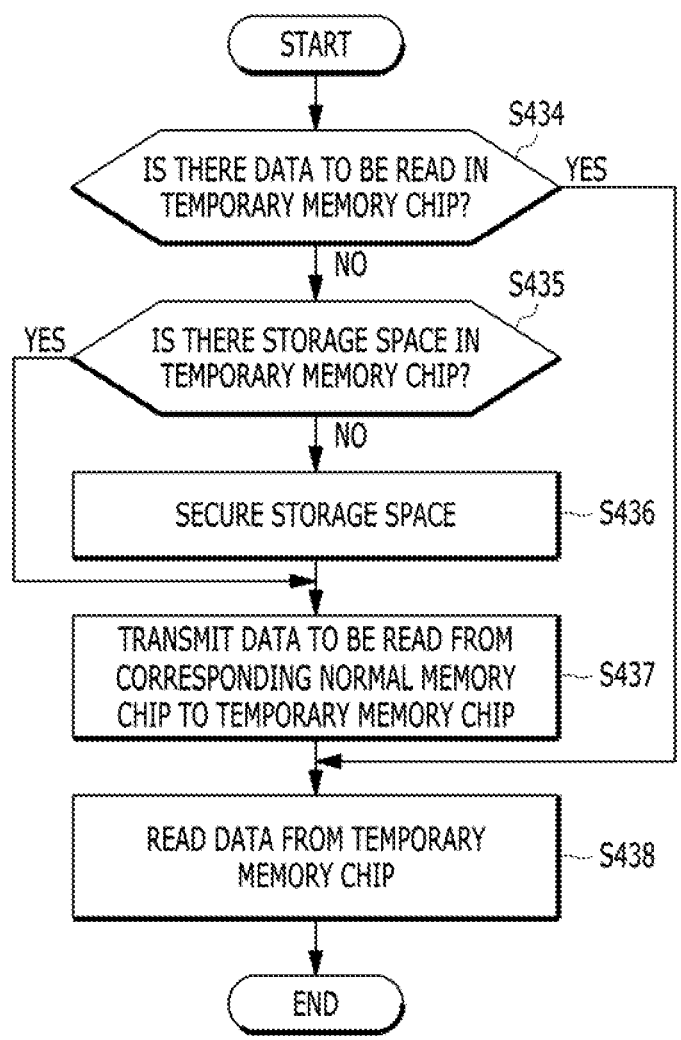

Hereinafter, an operation of the semiconductor device 400 having the aforementioned structure is described with reference to FIGS. 26 to 28.

Figure 26:
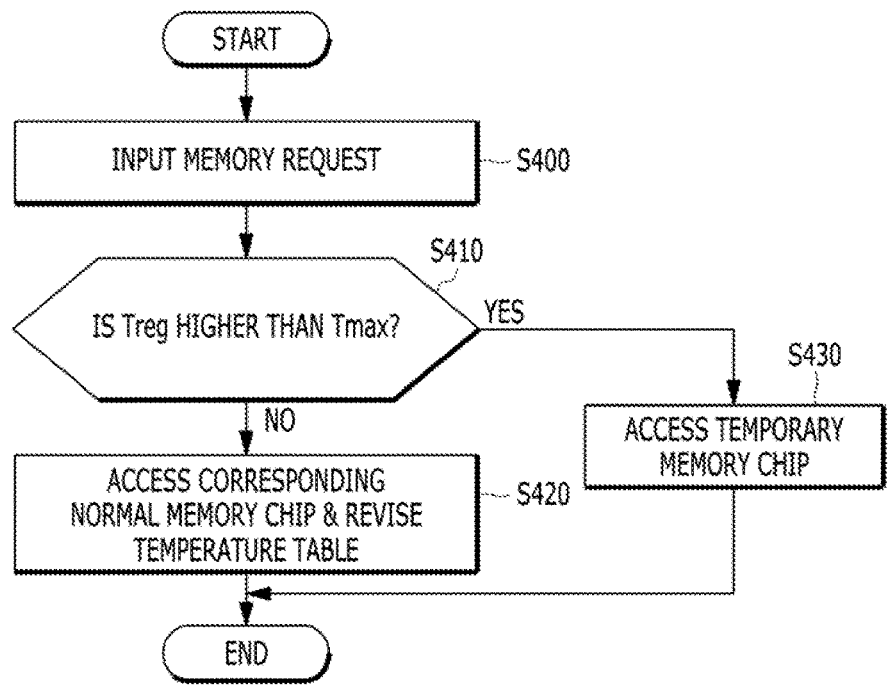
FIG. 26 is a flow chart illustrating a method for driving a semiconductor device according to yet another embodiment of the present invention.

Referring to FIG. 26 a method for driving the semiconductor device 400 according to yet another embodiment of the present invention may include inputting one or more access information among the first to fourth access information corresponding to the first to fourth normal memory chips 420 to 450 according to step S400, determining a degree of heating of a bank corresponding to the access information according to step S410, and accessing any one among normal memory chip corresponding to the access information and the temporary memory chip 460 based on the determination result according to steps S420 and S430.

The inputting of one or more access information according to step S400 may be carried out by an external device (not illustrated). Hereinafter, it is described as an example that the first access information corresponding to the first normal memory chip 420 is inputted. The first access information may include a chip identification code corresponding to the first normal memory chip 420, a bank address of an access target bank B# among the first to eighth banks B0 to B7 included in the first normal memory chip 420 and so on.

The determination of the degree of heating of the bank corresponding to the access information according to step S410 may be carried out by the control chip 410. For example, the heat determination block C1 may indirectly determine the degree of heating of Access target bank B# based on the first access information and the temperature table. The heat determination block C1 may indirectly determine that the degree of heating of Access target bank B# is bad when it is identified from the temperature table that the temperature readout information corresponding to a bank vertically adjacent to Access target bank B# (hereinafter, referred to as a "neighboring bank") among the first to eighth banks B0 to B7 of the second normal memory chip 430 is "1". This may prevent a concentration of the heating when Access target bank B# is accessed along with the neighboring bank. The heat determination block C1 may indirectly determine that the degree of heating of Access target bank B# is good when it is identified from the temperature table that the temperature readout information corresponding to the neighboring bank is "0".

Access to the normal memory chip corresponding to the access information and the temporary memory chip 460 according to steps S420 and S430 may include accessing the first normal memory chip 420 according to step S420 and accessing the temporary memory chip 460 according to step S430.

Access to the first normal memory chip 420 according to step S420 may be carried out by the control chip 410. For example, the memory access control block C2 may access the first normal memory chip 420 when it is determined that the degree of heating of the first bank B0 of the first normal memory chip 420 is good as determined of the heat determination block C1.

Access to the first normal memory chip 420 according to step S420 may further include revising or updating the temperature table. For example, the temperature table generation block C0 may revise or update the temperature readout information of Access target bank B# of the first normal, memory chip 420 based on the first access information.

Access to the temporary memory chip 460 according to step S430 may be carried out by the control chip 410. For example, the memory access control block C2 may access the temporary memory chip 460 when it is determined that the degree of heating of the first bank B0 of the first normal memory chip 420 is bad as determined of the heat determination block C1.

In accordance with embodiments of the present invention, a temporary memory region may be accessed instead of a normal memory region based on a determination of the degree of heating of the normal memory region, thereby reducing or preventing overheating of the memory region. Avoiding overheating may prevent data loss that would otherwise occur due to the overheating without the need for more frequent refresh operations which may require increased power consumption.

Also, as heating of the memory region to be accessed is reduced, the performance of a semiconductor device may be improved.

While the present invention has been described with respect to specific embodiments, the embodiments are not intended to be restrictive, but rather descriptive. Further, it is noted that the present invention may be achieved in various ways through substitution change, and modification, by those skilled in the art without departing from the spirit and or scope of the present invention as defined by the following claims.

What is claimed is:

1. A semiconductor device, comprising:
a first memory chip including a plurality of first memory regions;
a second memory chip stacked vertically on the first memory chip and including a plurality of second memory regions;
a temporary memory chip including a plurality of temporary memory regions; and
a control chip suitable for accessing a first access target memory region among the plurality of first memory regions or a first temporary memory region among the plurality of temporary memory regions based on first access information and first temperature readout information corresponding to the plurality of first memory regions,
wherein the control chip selects which region write data will be written into by comparing a threshold value with a temperature of the first access target memory region and comparing a second threshold value with a second temperature of a second memory region vertically adjacent to the first access target memory region,
wherein when the first temperature of the first access target memory region is lower than the first threshold value and the second temperature of the second memory region vertically adjacent to the first access target memory region is lower than the second threshold value, the control chip controls write data to be written in the first access target memory region,
wherein when the first temperature of the first access target memory region is higher than the first threshold value or the second temperature of the second memory region vertically adjacent to the first access target memory region is higher than the second threshold value, the control chip controls write data to be written in the first temporary memory region,
wherein the first memory chip includes a plurality of first temperature sensing blocks suitable for generating first oscillating signals corresponding to temperatures of the plurality of first memory regions, and
wherein the control chip includes a plurality of temperature readout blocks suitable for generating the first temperature readout information based on the first oscillating signals.

2. The semiconductor device of claim 1, wherein the control chip further includes:
a temperature table generation block suitable for generating a temperature table based on the first temperature readout information;
a heat determination block suitable for determining a heating degree of the first access target memory region based on the temperature table; and
a memory access control block suitable for accessing the first access target memory region or the first temporary memory region based on the first access information and a determination result of the heat determination block.

3. A semiconductor device, comprising:
a first normal memory chip including a plurality of first memory regions;
a second normal memory chip stacked vertically on the first normal memory chip and including a plurality of second memory regions;
a temporary memory chip including a plurality of temporary memory regions; and
a control chip suitable for accessing the first normal memory chip or the temporary memory chip based on whether, when one memory region among the plurality of the first memory regions is accessed, a second memory region vertically adjacent to the accessed first memory region among the plurality second memory regions is accessed,
wherein the control chip selects which region write data will be written into by determining whether or not the second memory region vertically adjacent to the first memory region is accessed,
wherein when the second memory region vertically adjacent to the first memory region is not accessed, the control chip controls write data to be written in the first normal memory chip, and,
wherein when the second memory region vertically adjacent to the first memory region is accessed, the control chip controls write data to be written in the temporary memory chip.

4. The semiconductor device of claim 3, wherein the control chip includes:
a temperature table generation block suitable for generating a temperature table based on first access information corresponding to the plurality of first memory regions and second access information corresponding to the plurality of second memory regions;
a heat determination block suitable for determining whether the second memory region vertically adjacent to accessed first memory region is accessed based on the temperature table; and
a memory access control block suitable for accessing the first normal memory chip or the temporary memory chip based on a determination result of the heat determination block.

5. A method for driving a semiconductor device, comprising:
determining a heating degree of a first access target memory region among a plurality of first memory regions based on a temperature table when first access information corresponding to a first normal memory chip including the plurality of first memory regions among a plurality of normal memory chips is inputted; and selecting a memory chip write data will be written into by comparing a threshold value with a temperature of the first access target memory region,
wherein when a temperature of the first access target memory region is lower than the threshold value performing a write operation for writing write data in the first normal memory chip,
wherein when a temperature of the first access target memory region is higher than the threshold value performing a write operation for writing write data in the temporary memory chip,
wherein the heating degree of the first access target memory region is determined based on whether a neighboring memory region vertically adjacent to the first access target memory region among a plurality of second memory regions included in a second normal memory chip is accessed, wherein when the neighboring memory region vertically adjacent to the first access target memory region is not accessed, performing a write operation for writing write data in the first normal memory chip, and wherein when the neighboring memory region vertically adjacent to the first access target memory region is accessed, performing a write operation for writing write data in the temporary memory chip.

6. The method of claim 5, further comprising:

generating the temperature table, wherein the temperature table is generated based on temperature readout information for each of the plurality of first memory regions supplied from the plurality of normal memory chips or a control chip or generated based on access information for each of the plurality of first memory regions.

7. The method of claim 5, further comprising:

determining a heating degree of a neighboring memory region vertically adjacent to the first access target memory region based on the temperature table after the heating degree of the first access target memory region is determined, wherein the first normal memory chip or the temporary memory chip is accessed based on a determination result of the heating degree of the first access target memory region and a determination result of the heating degree of the neighboring memory region.

8. The method of claim 5, wherein the selecting a memory chip write data will be written into includes:

determining whether there is a sufficient storage space in the temporary memory chip; and storing the write data in the temporary memory chip when it is determined that there is sufficient storage space in the temporary memory chip and storing the write data in the temporary memory chip after securing the storage space when it is determined that there is not enough storage space in the temporary memory chip.

9. The method of claim 8, wherein the selecting a memory chip write data will be written into includes transmitting the write data written in the temporary memory chip to the first access target memory region during an idle period.

10. The method of claim 5, wherein the selecting a memory chip write data will be written into includes performing a read operation for reading a read data from the first normal memory chip or the temporary memory chip.

11. The method of claim 10, wherein the selecting a memory chip write data will be written into includes:

checking whether the read data is stored in the temporary memory chip;

reading the read data from the temporary memory chip when it is checked that the read data is stored in the temporary memory chip, or determining whether there is a sufficient storage space in the temporary memory chip when it is checked that the read data is not stored in the temporary memory chip; and reading the read data from the normal memory chip to store the read data in the temporary memory chip and reading the read data from the temporary memory chip when it is determined that there is sufficient storage space in the temporary memory chip, or reading the read data from the normal memory chip to store the read data in the temporary memory chip and reading the read data from the temporary memory chip after securing the storage space when it is determined that there is not enough storage space in the temporary memory chip.

* * * * *